(12) United States Patent
Shau

(10) Patent No.: US 7,180,338 B2
(45) Date of Patent: Feb. 20, 2007

(54) HIGH PERFORMANCE LOW POWER MULTIPLE-LEVEL-SWITCHING OUTPUT DRIVERS

(75) Inventor: Jeng-Jye Shau, Palo Alto, CA (US)

(73) Assignee: Uniram Technology Inc.

( * ) Notice: Subject to any disclaimer, the term of this patent is extended or adjusted under 35 U.S.C. 154(b) by 31 days.

(21) Appl. No.: 11/098,991

(22) Filed: Apr. 5, 2005

(65) Prior Publication Data

US 2006/0220705 A1    Oct. 5, 2006

(51) Int. Cl.
*H03B 1/00*    (2006.01)
(52) U.S. Cl. ...................................... 327/112
(58) Field of Classification Search ............... 327/108, 327/112; 326/83, 84, 85
See application file for complete search history.

(56) References Cited

U.S. PATENT DOCUMENTS

| | | | | |
|---|---|---|---|---|
| 4,816,705 A | * | 3/1989 | Ohba et al. | 326/110 |
| 6,384,658 B1 | * | 5/2002 | Jex | 327/295 |
| 6,560,290 B2 | * | 5/2003 | Ahn et al. | 375/259 |
| 6,958,632 B2 | * | 10/2005 | Nair | 327/112 |

* cited by examiner

*Primary Examiner*—My-Trang Nu Ton

(57) ABSTRACT

Long existing performance, noise, and power consumption problems of prior art output drivers are solved by using n-channel transistors as pull up transistors and p-channel transistors as pull down transistors for high performance output drivers. Output drivers of the present invention can be fully compatible with HSTL or SSTL interfaces without using termination resistors. High resolution switching applications are also made possible without consuming much power. Output drivers of the present invention provide excellent solutions to support high performance interface while consuming much lower power.

28 Claims, 10 Drawing Sheets

FIG. 1(a) Prior art CMOS driver
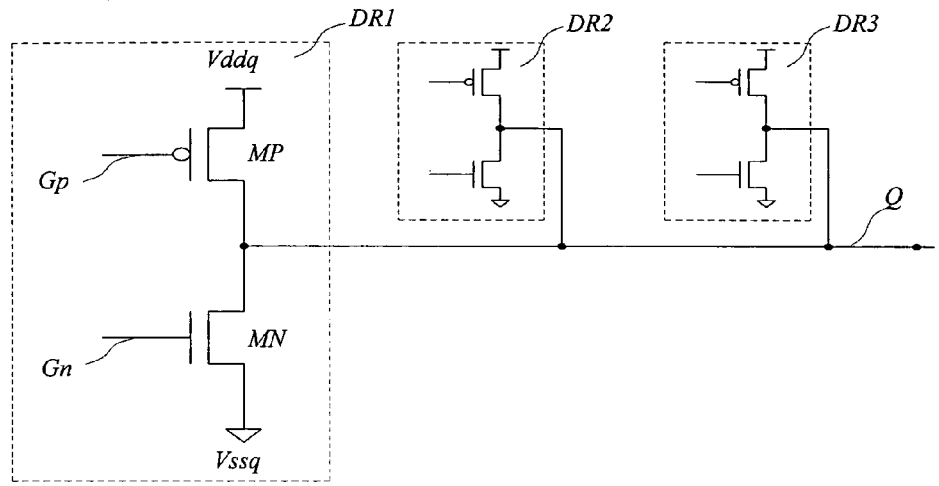
FIG. 1(b) Prior art timing control
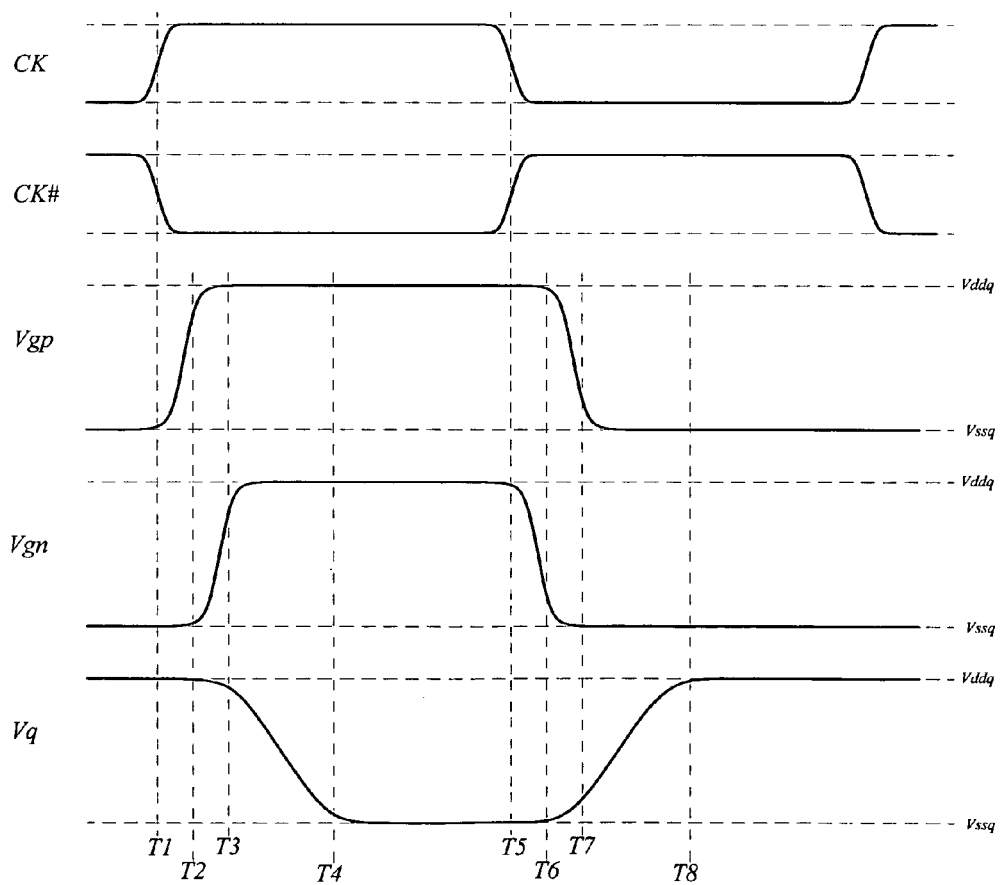

*FIG. 2(a) Prior art CMOS HSTL driver*
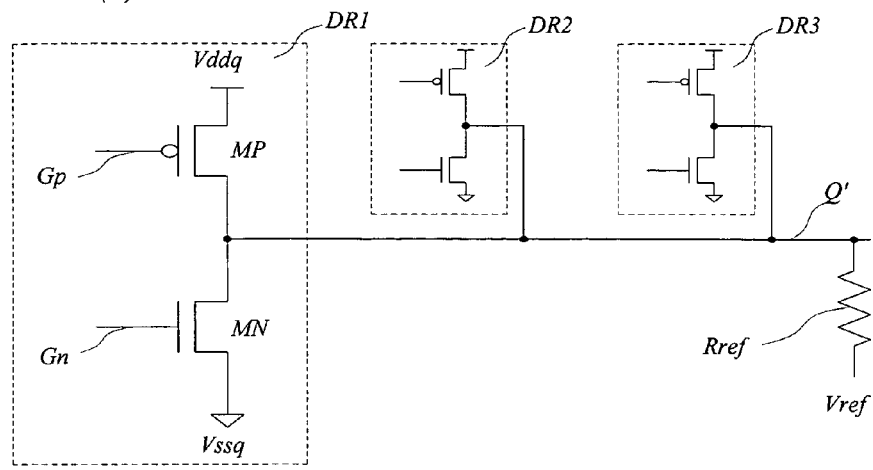
*FIG. 2(b) Prior art timing control*
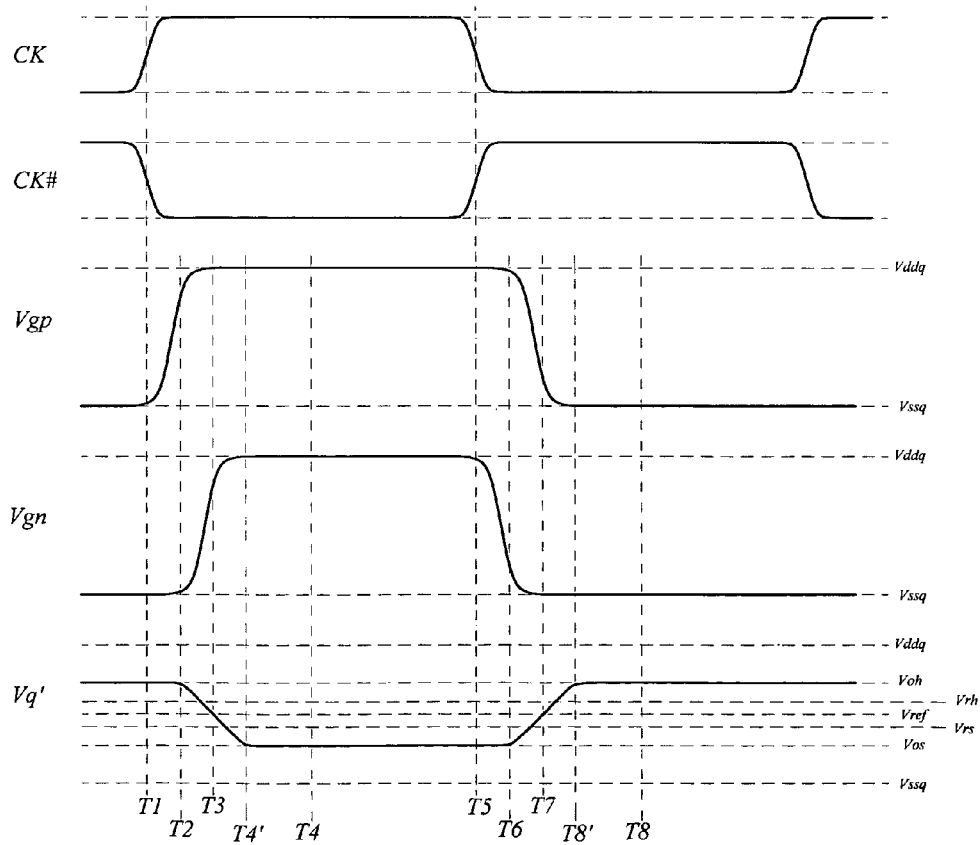

HIGH PERFORMANCE LOW POWER MULTIPLE-LEVEL-SWITCHING OUTPUT DRIVERS

BACKGROUND OF THE INVENTION

1. Field of the Invention

The present invention relates to output drivers for integrated circuits (IC), and more particularly to low power, high performance output drivers designed to drive multiple-level switching partial-voltage signals.

2. Description of the Prior Art

Today, IC technologies have progressed into nanometer (nm) ranges. Current art 65 nm logic technologies provide transistors with switching time measured by $10^{-12}$ seconds (ps). It has become a routine practice to design logic circuits capable of executing billions or even trillions of operations per second. Such powerful core circuits require the supports of powerful interface circuits. Otherwise, input/output (I/O) bandwidth would become the performance bottleneck in high performance systems. It is therefore highly desirable to provide methods to improve the performance of I/O circuits for integrated circuits.

An output driver, by definition, is the last-stage circuit used to drive output signals from an IC to external components. A high performance output driver defined in this patent disclosure is the last-stage circuit used to drive high performance switching signals from an IC to external components while it is designed to support output signal switching rate higher than thousands, millions, or even billions of cycles per second. The performance of such output drivers has significant impacts to overall system performance.

The most common output drivers used by prior art IC are CMOS (complemented metal-oxide-semiconductor) drivers. CMOS drivers consume little power at steady state, and provide signals in full amplitude of I/O power supply voltage to represent digital data. However, switching noise related problems limited CMOS drivers in supporting high performance interfaces. It is therefore highly desirable to provide output drivers that can avoid switching noise problems to support high performance operations.

The most popular prior art method used to improve the performance of CMOS drivers is to reduce the amplitude of the output signals by introducing one or more termination resistor(s) to each signal line. The termination resistor is typically connected to a reference voltage equal to half of the I/O power supply voltage. The same reference voltage is also used for input data sensing. This method is called "high-speed transceiver logic" (HSTL) interface when it is used by high end SRAM (static random access memory) interface. A nearly identical method is also called "stub series terminated logic" (SSTL) interface when it is used by DRAM (dynamic random access memory) interface. These type of methods are called "small amplitude interfaces" (SAI) in our discussions. SAI effectively improved interface performance relative to conventional CMOS interfaces. However, SAI drivers consume power even when they are not switching data, and they still suffer most of the noise problems suffered by conventional CMOS drivers. It is therefore highly desirable to provide further improvements in performance relative to SAI while consuming little power at steady states.

Wireless devices such as cellular phones have progressed in explosive pace. Battery powered portable devices always require low power consumption. In the mean time, the demands for higher performance increase dramatically with each generation of wireless products. For example, cellular phones used to have no or very simple displays; now they require colored liquid crystal display (LCD) at high resolution. A current art LCD driver can send out 132 RGB signals (total 396 digital-to-analogy converter output signals) with 6 bit accuracy (64 levels) switching around 12 KHZ. Such IC devices require high accuracy, low power, digital-to-analog (D/A) output drivers. Most of prior art digital-to-analog converters use operation amplifiers with negative feedback to provide high accuracy output signals, but operation amplifiers typically consume a lot of power and have poor switching speed. Tsuchi disclosed an LCD driver design in U.S. Pat. No. 6,124,997 that does not use operation amplifiers; the method requires pre-charging each output line before driving a new data. The pre-charge operation will consume power no matter the data is changed or not. Since Tsuchi only use pull down driver, the method is sensitive to noises that cause the output signal to drop below targeted voltages. It is therefore highly desirable to provide low power output drivers that can support high accuracy switching signals.

SUMMARY OF THE INVENTION

The primary objective of this invention is, therefore, to provide output drivers that consume little power at steady state while avoiding switching noise problems to support high performance operations. The other primary objective of this invention is to provide output drivers that can switch between multiple levels of high accuracy output voltages while consuming minimum power. Another objective is to support small amplitude interface protocols without using termination resistors. These and other objectives are achieved by using output drivers comprising n-channel pull up transistors and p-channel pull down transistors bias with proper gate voltages. The resulting circuits are capable of supporting high performance synchronized signals or high accuracy multiple level signals while consuming much less power than prior art options.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIGS. 1(*a*, *b*) illustrate the structures and operation principles of prior art CMOS drivers;

FIGS. 2(*a*, *b*) illustrate the structures and operation principles of prior art SAI drivers;

FIG. 3(*c*) shows the current-voltage relationship of the output driver shown in FIG. 3(*a*);

FIGS. 3(*d–i*) are schematic diagrams showing variations of output driver designs of the present invention;

DETAILED DESCRIPTION OF THE INVENTION

Figure 3A:
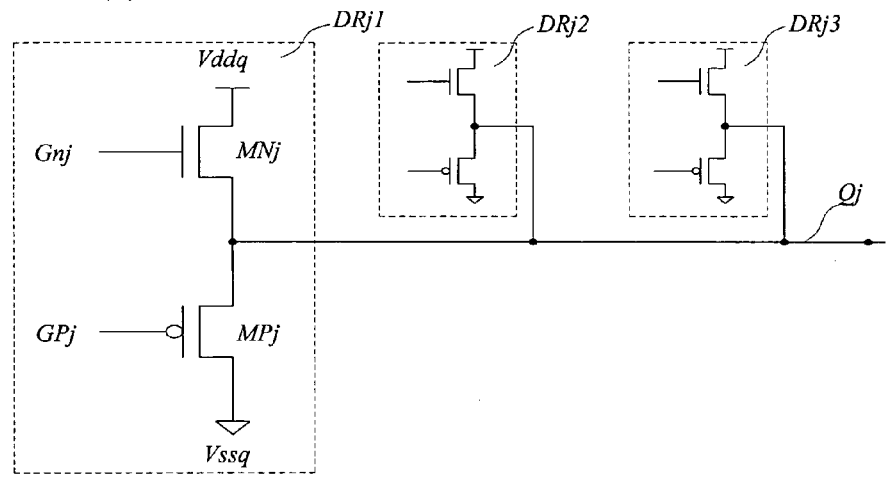
FIGS. 3(*a*, *b*) illustrate the structures and operation principles of a basic output driver of the present invention.

The operation principles of prior art output drivers are first discussed to facilitate clear understanding of the present invention.

FIG. 1(a) is a schematic diagram showing the basic elements of a prior art CMOS output driver (DR1). An output driver is defined as the last-stage circuit used to drive output signals from an IC to external components. A high performance output driver defined in this patent disclosure is the last-stage circuit used to drive high performance switching signals from an IC to external components while it is designed to support output signal switching rate higher than thousands, millions, or even billions of cycles per second. This prior art output driver (DR1) comprises a p-channel pull up transistor (MP) and an n-channel pull down transistor (MN). A pull up transistor is defined as a transistor configured to provide channel current in a direction to pull the output signal only to higher voltage. A pull down transistor is defined as a transistor that is configured to provide channel current in a direction to pull the output signal only to lower voltage. An n-channel transistor is defined as a transistor that uses electrons as the majority carrier to carry its channel current. A p-channel transistor is defined as a transistor that uses holes as the majority carrier to carry its channel current. One transistor shown in a schematic diagram can comprise many legs of transistors connected in parallel.

For the prior art output driver (DR1) in FIG. 1(a), the source electrode of the p-channel pull up transistor (MP) is connected to an upper power supply line at voltage Vddq. The source electrode of the n-channel pull down transistor (MN) is connected to a lower power supply line at voltage Vssq, where Vssq<Vddq and it is usually at ground voltage. The drain electrode of the p-channel pull up transistor and the drain electrode of the n-channel pull down transistor are both connected to an external signal line (Q). An "external signal line" is defined as a signal line connecting to external signal out of an IC chip. The gate electrode (Gp) of the p-channel pull up transistor (MP) is driven at a gate voltage Vgp, and the gate electrode (Gn) of the n-channel pull down transistor (MN) is driven at a gate voltage Vgn. More output drivers (DR2, DR3) from different circuits can be connected to the same external signal line (Q).

The structures of this prior art CMOS output driver (DR1) may appear to be as simple as an internal CMOS inverter, but there are many complications caused by the fact that the driver needs to provide large currents to drive heavy loading on an external signal line.

FIG. 1(b) shows example timing control waveforms to illustrate the operation principles of the prior art CMOS driver in FIG. 1(a). In this example, the timing is synchronized by a pair of clock signals (CK, CK#). The clock signal (CK) rises at time T1, while the complemented clock signal (CK#) rises at half cycle time at T5, as illustrated in FIG. 1(b). Before time T1, Vgp=Vgn=Vssq and the out put voltage (Vq) on the external signal line (Q) is held at voltage Vddq. The rising edge of clock signal (CK) at time T1 triggers the output driver to send out next data. However, prior art output driver can not turn on the driver immediately. It is very important to avoid the situation when both output transistors (MP, MN) are partially turned on; otherwise a large current would flow from Vddq through MP and MN to Vssq, causing severe noise problems. It is therefore a common practice to turn off MP by pulling its gate voltage (Vgp) toward Vddq starting at T1 before pulling up the gate voltage of MN (Vgn) toward Vddq at a latter time T2, as shown by FIG. 1(b). This method effectively reduces noise problem but it introduces an additional delay (T2−T1) that slows down the output driver. We will call this delay time as the "flow through current prevention delay time" in the following discussions. After T2, the p-channel pull up transistor (MP) is turned off and the n-channel pull down transistor (MN) is turned on to pull Vq down to Vssq as shown by the waveforms in FIG. 1(b). During this time, a large current (called "switching current") flows from Vssq through MN to Q causing large noise on Vssq and Q. In the mean time, the switching gate voltages (Vgp, Vgn) also cause capacitance induced coupling noises during the switching events between T1 and T4; this coupling noise is of opposite sign as the output signal so that it slows down the output signal. The pull down switching rate of the output voltage increases with increasing channel currents of the pull down n-channel transistor (MN) but the switching noises and coupling noises also increase with increasing driving power. This caused a dilemma that prior art CMOS drivers can not achieve both high switching rate while conserving signal integrity at the same time. Due to noise consideration, typically we have to tolerate a slow switching rate on the output signal. Typical prior art output drivers adjust the switching rate at around 2 volts per nanosecond, which is about two orders of magnitude slower than that of IC core circuits. Using faster transistors won't help because the resulting noise will destroy signal integrity. This is one of the reasons that interface delay time often became performance bottleneck for high performance IC. When the output voltage (Vq) completely reaches Vssq after time T4, the driver consumes little power and the system is finally stable.

For a double data rate (DDR) protocol, the rising edge of the complemented clock signal (CK#) at time T5 triggers the output driver to send out another data. FIG. 1(b) illustrates the procedures to switch the output voltage from Vssq back to Vddq after time T5. To prevent flow through current noise problem, we still need to turn off MN by pulling Vgn toward Vssq starting at an earlier time (T5) before pulling Vgp toward Vssq at a latter time (T6). This method effectively reduces noise problem but it introduces additional delay (T6−T5). After T6, the n-channel transistor (MN) is turned off and the p-channel transistor (MP) starts to pull output voltage (Vq) up to Vddq as shown by the waveforms in FIG. 1(b). During this time, a large switching current flows from Vddq through MP to Q, causing large noise on Vddq and Q. In the mean time, the switching gate voltages (Vgp, Vgn) also cause capacitance induced coupling noises during the switching events between T5 and T8. The pull up switching rate is again limited by noise consideration. We still need to tolerate a relatively slow swing rate on output signal (Vq). When the output voltage completely reaches Vddq after time T8, the driver (DR1) consumes little power and the system is stable.

We can turn off this output driver (DR1) by setting Vgp=Vddq and Vgn=Vssq so that the output driver is at high impedance state to allow other output drivers (DR2, DR3) to drive the external signal line (Q).

The major advantages for prior art CMOS drivers are that they consume little power at steady states, and that they provide full scale outputs at power supply voltages (Vddq, Vssq) to represent digital signals. These advantages make CMOS drivers the most popular drivers for integrated circuits. However, CMOS drivers can consume large power and cause severe noise problems during switching time. The switching noise problems and the "flow through current prevention delay time" limit the applications of CMOS output drivers in high performance applications.

FIGS. 2(a,b) illustrate the most popular prior art method used to improve the performance of CMOS drivers. This method is called "high-speed transceiver logic" (HSTL) interface when it is used by high end SRAM (static random access memory) interface. A nearly identical method is also called "stub series terminated logic" (SSTL) interface when it is used by DRAM (dynamic random access memory) interface. The major difference between the CMOS interface shown in FIG. 1(a) and the HSTL or SSTL interface shown in FIG. 2(a) is that a termination resistor (Rref) is added to the external signal line (Q'). Typical value of Rref is 50 ohms. This termination resistor (Rref) is connected to a reference voltage (Vref) typically adjusted to the middle of power supply voltage as Vref=(Vddq+Vssq)/2. Prior art HSTL or SSTL interfaces still can use the same CMOS drivers to support their operations as illustrated by the schematic diagram in FIG. 2(a). Since the pull up and pull down transistors (MN, MP) need to fight with the termination resistor (Rref), the output voltage (Vq') switches within a smaller range between Voh and Vos as illustrated in FIG. 2(b). We will call this type of interface as "small amplitude interface" (SAI) in the following discussions. We will call Voh as "SAI upper voltage", and call Vos as "SAI lower voltage". Typically, Voh is required to be around [Vref+(Vddq−Vssq)/4], and Vos should be around [Vref−(Vddq−Vssq)/4]. A logic state '1' is defined as a voltage higher than a voltage Vrh~[Vref+(Vddq−Vssq)/8]. A logic state '0' is defined as a voltage lower than a voltage Vrs~[Vref−(Vddq−Vssq)/8]. For example, when Vddq=1.8 volts and Vssq=0 volts, SSTL specification requires that Vref=0.9 volts, Voh~1.4 volts, Vos~0.4 volts, Vrh~1.1 volts, and Vrs~0.7 volts.

FIG. 2(b) shows example timing waveforms to illustrate the operation principles of SAI in comparison with CMOS interface waveforms in FIG. 1(b). Similar to previous example, we set the output driver (DR1) gate voltages at Vgp=Vgn=Vssq before time T1. The terminal resistor (Rref) fight with the p-channel pull up transistor (MP) so that the output voltage (Vq') is held at SAI upper voltage (Voh) instead of Vddq as shown in FIG. 1(b). The rising edge of clock signal (CK) at time T1 triggers the output driver to send out next data. Before we try to switch the output voltage (Vq') on Q', we still need to avoid the situation when both output transistors (MP, MN) are partially turned on. It is still necessary to turn off MP by pulling the gate voltage of MP (Vgp) toward Vddq at T1 before pulling up the gate voltage of MN (Vgn) toward Vddq at a latter time T2, as shown by FIG. 2(b). After T2, the p-channel transistor (MP) is turned off and the n-channel transistor (MN) is turned on to pull down output voltage (Vq') as shown by the waveforms in FIG. 2(b). During this time, we still have switching current and coupling voltage induced noise problems. The difference is that Vq' is pulled to SAI lower voltage (Vos) instead of Vssq because the pull down n-channel transistor (MN) needs to fight with the termination resistor (Rref). For an SAI, the output voltage (Vq') switches between Voh and Vos, instead of Vddq and Vssq. Since the amplitude of the output voltage swing is about half of that of the CMOS interface in FIG. 1(b), the same driver will be able to switch at a faster time (T4' instead of T4) when all the other conditions are the same, as illustrated in FIG. 2(b).

Similar to the example in FIG. 1(b), the rising edge of complemented clock signal (CK#) at time T5 triggers the output driver to send out another data. FIG. 2(b) also illustrates the procedures to switch the output voltage from SAI lower voltage (Vos) back to SAI upper voltage (Voh). To prevent flow through current noise problem, we still need to turn off MN by pulling Vgn toward Vssq at an earlier time (T5) before pulling Vgp toward Vssq at a latter time (T6). After T6, the n-channel pull down transistor (MN) is turned off and the p-channel pull up transistor (MP) starts to pull output voltage (Vq') up to Voh as shown by the waveforms in FIG. 2(b) between time T7 and T8'. Again, the switching is finished at a faster time (T8' instead of T8) due to smaller voltage swing.

We can turn off this output driver (DR1) by setting Vgp=Vddq and Vgn=Vssq so that the output driver is at high impedance state to allow other output drivers (DR2, DR3) to drive Q'.

SAI methods improve interface performance by reducing the amplitude of switching output signals. That is achieved by using a termination resistor to fight with output drivers; the resulting circuits always consume power even at steady states. Typically, a SAI driver needs to provide a current around 15 mini-Amps to fight with the termination resistor. A 72-signal data bus will consume about 1 Amp of current even when there is no switching activity. This is a tremendous waste in energy. In addition, SAI drivers still suffers the same switching noise problems and the "flow through current prevention delay time" as CMOS output drivers. It is highly desirable to provide an output driver that has the advantages of small amplitude switching while removing the noise and power problems.

FIG. 3(a) is a schematic diagram showing simplified structures for an output driver (DRj1) of the present invention. This output driver (DRj1) also comprises a p-channel transistor (MPj) and an n-channel transistor (MNj). The differences are that the p-channel transistor (MPj) is configured as a pull down transistor, and that the n-channel transistor (MNj) is configured as a pull up transistor. A pull up transistor is defined as a transistor configured to provide channel current in a direction to pull the output signal only to higher voltage. A pull down transistor is defined as a transistor that is configured to provide channel current in a direction to pull the output signal only to lower voltage. An n-channel transistor is a transistor that uses electrons as the majority carrier to carry its channel current. A p-channel transistor is a transistor that uses holes as the majority carrier to carry its channel current. Prior art output drivers use n-channel transistors as pull down transistors, and use p-channel transistors as pull-up transistors. The present invention inverts the rolls of the driving transistors in output drivers by using n-channel transistors as pull up transistors, and using p-channel transistors as pull down transistors to drive external signals.

In FIG. 3(a), the source electrode of the n-channel pull up transistor (MNj) is connected to an upper power supply line at voltage Vddq, and the source electrode of the p-channel pull down transistor (MPj) is connected to a lower power supply line at voltage Vssq, where Vssq<Vddq and it is often set to ground voltage. The drain electrode of the p-channel pull down transistor (MPj) and the drain electrode of the n-channel pull up transistor (MNj) are both connected to an external signal line (Qj). At driving conditions, the gate electrode (Gnj) of the n-channel pull up transistor (MNj) is set to a gate voltage (Vgnj) that is higher than a target output voltage (Vqtn) by about one threshold voltage (Vtn) of the n-channel transistor (MNj) as Vgnj~(Vqtn+Vtn). The gate electrode (Gpj) of the p-channel pull down transistor (MPj) is set to a gate voltage (Vgpj) that is lower than a target output voltage (Vqtp) by about one threshold voltage (Vtp) of the p-channel transistor (MPj) as Vgpj~(Vqtp−Vtp).

In this configuration, the channel current of the pull up n-channel transistor (MNj) is controlled by its gate voltage Vgnj relative to the out put voltage (Vqj). When (Vgnj−Vqj) is smaller than the threshold voltage (Vtn) of the n-channel transistor (MNj), the transistor is turned off. When (Vgnj−Vqj) is larger than Vtn, the channel current (Isn) of the n-channel pull up transistor (MNj) can be described by a text book equation as $$Isn=Kn(Wn/Ln)(Vgnj-Vqj-Vtn)^2 \sim Kn(Wn/Ln)(Vqtn-Vqj)^2 \quad (EQ1)$$

where (Wn/Ln) is the width/length ratio of the transistor, and Kn is a parameter dependent on electron mobility. In other words, the n-channel pull up transistor (MNj) will pull up the output voltage Vqj toward the target voltage Vqtn if its gate voltage is set as Vgnj~Vqtn+Vtn. The driving channel current (Isn) increase rapidly with (Vqtn−Vqj) but the driving current is very small once the output voltage Vqj is pulled near the target voltage Vqtn. This circuit configuration has an automatic negative feedback mechanism.

Similarly, the driving capability of the pull down p-channel transistor (MPj) is controlled by its gate voltage Vgpj relative to the out put voltage (Vqj). When (Vqj−Vgpj) is smaller than the amplitude of the threshold voltage (Vtp) of the p-channel transistor (MPj), the transistor is turned off. When (Vqj−Vgpj) is larger than Vtp, the channel current (Isp) of the p-channel pull down transistor (MPj) can be described by a text book equation as $$Isp=Kp(Wp/Lp)(Vqj-Vgpj-Vtp)^2 \sim Kp(Wp/Lp)(Vqj-Vqtp)^2 \quad (EQ2)$$

where (Wp/Lp) is the width/length ratio of the transistor, and Kp is a parameter dependent on hole mobility. In other words, the p-channel pull down transistor (MPj) will pull down the output voltage Vqj toward the target voltage Vqtp if its gate voltage is set as Vgpj~Vqtp−Vtp. The driving current increase rapidly with (Vqj−Vqtp) but the driving current is very small once the output voltage Vqj is pulled near the target voltage Vqtp. This circuit configuration has an automatic negative feedback mechanism.

For most of applications, the target voltage (Vqtn) for the n-channel pull up transistor and the target voltage (Vqtp) for the p-channel pull down transistor are set to be about the same as Vqtp~Vqtn~Vqt so that both transistors will drive the output voltage toward the same voltage, but there are exceptions.

Figure 3B:
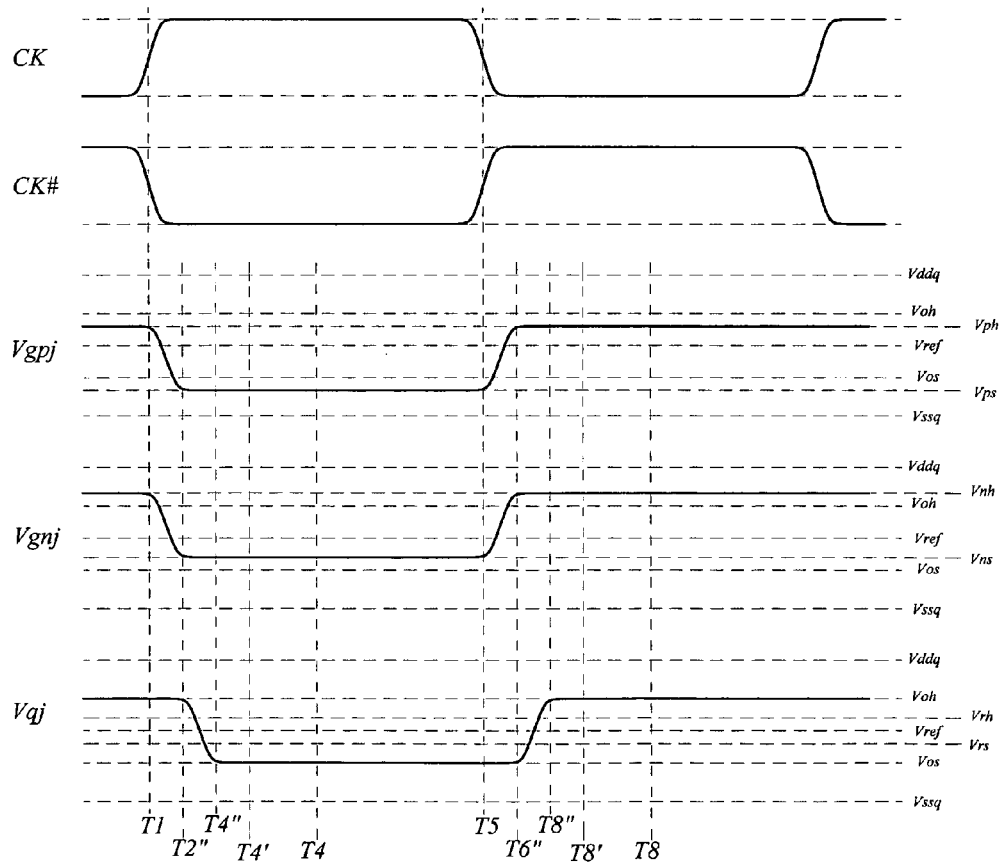
Figure 3C:
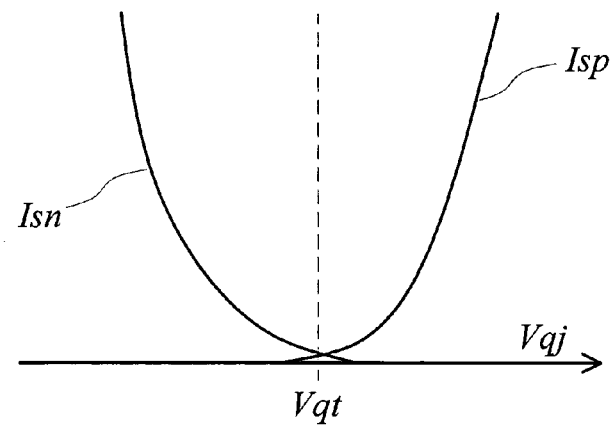

FIG. 3(c) shows the current-voltage relationship of the output driver (DRj1) when Vqtp~Vqtn~Vqt. The actual current-voltage (I-V) relationships of modern transistors are more complicated than those simplified equations (EQ1, EQ2). The threshold voltages (Vtp, Vtn) are also complex functions of bias voltages due to body effects. However, the general principles are correct. By setting gate voltages Vgpj~Vqt−Vtp and Vgnj~Vqt+Vtn, the output driver (DRj1) will pull the output voltage (Vqj) toward the target voltage (Vqt). The driving currents of the output driver increase rapidly with the difference between Vqj and Vqt, and the driver consumes little power once Vqj is pulled close to target voltage Vqt. In other words, an output driver of the present invention can pull its output voltage to an analog voltage with strong driving power, while holding the output voltage at the target voltage without consuming much power.

An output driver, by definition, is the last-stage circuit used to drive output signals from an IC to external components. A high performance output driver defined in this patent disclosure is the last-stage circuit used to drive high performance switching signals from an IC to external components while it is designed to support output signal switching rate higher than thousands, millions, or even billions of cycles per second. Prior art reference voltage generators have used similar negative feedback mechanism to generate reference voltages at fixed levels. A typical example would be the bit line pre-charge voltage generator for memory devices as discussed in U.S. Pat. No. 6,216,246. Reference voltage generators are designed to drive constant or near-constant target voltages; the output voltages of reference voltage generators maybe adjustable, but reference voltage generators are not designed to support frequent switching output voltages. The present invention discloses methods to use n-channel pull up transistors in combination with p-channel pull down transistors to drive high performance synchronized switching interface signals so that the structures and design considerations in our circuits are optimized to reduce switching noises and to improve switching performances.

Based on the above principles, we can use the output driver (DRj1) shown in FIG. 3(a) to drive output signals compatible with the SAI signals shown in FIG. 2(b) without using a termination resistor (Rref). When we set the gate voltage of the n-channel pull up transistor as Vgnj=Vnh~Voh+Vtn, and set the gate voltage of the p-channel pull down transitor as Vgpj=Vph~Voh−Vtp, the driver will pull the output voltage (Vqj) toward SAI upper voltage (Voh) just like a prior art SAI driver, but a driver of the present invention can hold the voltage at Voh without using termination resistor (Rref) so that it consumes little power. If the output voltage (Vqj) drifts below Voh, the n-channel pull up transistor (MNj) will have a strong driving power to pull Vqj back to Voh, while the p-channel pull down transistor (MPj) remains off. If the output voltage (Vqj) drifts above Voh, the p-channel pull down transistor (MPj) will have a strong driving power to pull Vqj back to Voh, while the n-channel pull up transistor (MNj) remains off. When we set the gate voltage of the n-channel pull up transistor as Vgnj=Vns=Vos+Vtn, and set the gate voltage of the p-channel pull down transistor as Vgpj=Vps=Vos−Vtp, the driver (DRj1) will pull the output voltage (Vqj) toward SAI lower voltage (Vos) just like a prior art SAI driver, but the output driver of the present invention can hold the voltage at Vos without a termination resistor (Rref). Under this condition, the driver will consume little power when Vqj~Vos. The symbol "~" means "approximately equal to" and we will use this symbol frequently in our discussions. If the output voltage (Vqj) drifts below Vos, the n-channel pull up transistor (MNj) will have a strong driving power to pull Vqj back to Vos, while the p-channel pull down transistor (MPj) remains off. If the output voltage (Vqj) drifts above Vos, the p-channel pull down transistor (MPj) will have a strong driving power to pull Vqj back to Vos, while the n-channel pull up transistor (MNj) remains off.

FIG. 3(b) shows example timing waveforms to illustrate the operation principles of the output driver in FIG. 3(a) in comparison to the prior art SAI timing shown in FIG. 2(b). Before time T1, gate voltage Vgpj is set to Vph~Voh−Vtp and gate voltage Vgnj is set to Vnh~Voh+Vtn. As discussed in previous sections, the output voltage (Vqj) is held at SAI upper voltage (Voh) under this condition; the output voltage is therefore compatible with the SAI voltage shown in FIG. 2(b). The rising edge of clock signal (CK) at time T1 triggers the driver to send out next data. At time T1, we start to pull Vgpj to Vps, and Vgnj to Vns as shown in FIG. 3(b). It is very important to see that MNj will remain off all the time during this switching event, and there is no need to worry about flow through current for output drivers of the present invention. It is therefore perfectly all right to switch both gate voltages simultaneously without adding "flow through current prevention delay time" like prior art drivers. The switching time of gate voltages (Vgnj, Vgpj) also can be faster than that of the prior art drivers because of smaller switching amplitudes. Therefore, both gate voltages should be stable at a time (T2") faster than the time (T3) for prior art drivers shown in previous examples. The p-channel pull down transistor (MPj) has strong driving power to pull Vqj toward Vos, and the driving power will decrease as Vqj is driven closer to target voltage Vos. In other words, an output driver of the present invention consumes power only when it needs to pull the output voltage toward target voltage. This efficient usage of power helps to minimize switching noise. In addition, the gate voltages (Vgpj, Vgnj) switch in the same direction as the out put voltage. Therefore, the capacitor coupling effect actually helps the signal switching instead of slowing it down like prior art drivers. Due to the above advantages, we can use stronger drivers to switch the output voltage (Vqj) to Vos at a time (T4") faster than SAI driver (at time T4') as illustrated in FIG. 3(b). The driver (DRj1) will hold Vqj at Vos, making it fully compatible with the SAI interface without using termination resistor.

Similar to the example in FIG. 1(b), the rising edge of the complemented clock signal (CK#) at time T5 triggers the driver to send out another data. FIG. 3(b) also illustrates the procedures to switch the output voltage from SAI lower voltage (Vos) back to SAI upper voltage (Voh). At time T5, we start to switch the output voltage (Vqj) to Voh by pulling Vgpj to Vph, and pulling Vgnj to Vnh as shown in FIG. 3(b). Since MPj will remain off all the time during this switching event, it is perfectly all right to switch both gate voltages simultaneously without adding "flow through current prevention delay time". The switching time of gate voltages (Vgnj, Vgpj) also can be faster than the prior art drivers because of smaller switching amplitudes. Therefore, both gate voltages should be stable at a time (T6") faster than the time (T7) for prior art drivers. The n-channel pull up transistor (MNj) has strong driving power to pull Vqj toward Voh, and the driving power will decrease as Vqj is driven closer to target voltage Voh. This automatic adjustment in driving capability can reduce switching noise dramatically. In addition, the capacitor coupling voltages has the same polarity as the output voltage. In other word, the capacitor coupling effect actually helps the switching process. Due to the above advantages, the output voltage (Vqj) can be switched to Voh at a time (T8") faster than SAI driver (at time T8') as illustrated in FIG. 3(b). The driver (DRj1) will hold Vqj at Voh, making it fully compatible with SAI without using the termination resistor (Rref).

The above example shows that output drivers of the present invention can drive output signals at voltage levels fully compatible with existing SAI systems while achieving better performance and consuming less power.

We also can turn off the output driver (DRj1) of the present invention by setting Vgpj=Vddq and Vgnj=Vssq so that the output driver is at high impedance state to allow other output drivers (DRj2, DRj3) to drive Qj. Another way is to set Vgpj=Vph and Vgnj=Vns to put the driver (DRj1) into high impedance state. Under this condition, the driver still allows other drivers to drive Qj, while it can help to confine the output voltage (Vqj) within SAI ranges (between Voh and Vos) even when no driver is activated. This is an example for the situations when the target voltage for the n-channel pull up transistor is different from the target voltage for the p-channel pull down transistor.

The above example shows that the output driver of the present invention has the following advantages over prior art SAI drivers:

(1) It can drive output voltages fully compatible with SAI standards (such as the HSTL or SSTL interface standards) without using a termination resistor, achieving significant power savings.
(2) The gate voltages of the output driver of the present invention also swing with small amplitudes, making it possible to achieve faster switching time.
(3) The gate voltages switch in the same direction as the output voltage so that capacitor coupling noises are not causing problems.
(4) The pull up transistor and the pull down transistor of an output driver of the present invention are never turned on simultaneously at normal operations. Therefore, we do not need to worry about "flow through current prevention delay time". The switching time is faster, and the control circuit is simpler.
(5) The output driver of the present invention has strong driving power when the output voltage is far from the target voltage, while the driving power decreases as the output voltage approaches the target voltage. This automatic adjustment in driving power minimizes the switching noise while achieving fast switching time.
(6) The output driver of the present invention can be biased into high impedance state while stabilizing the output voltage to stay within SAI range without using a termination resistor.

The most significant disadvantage for output driver of the present invention is that its driving currents are smaller than prior art drivers of equivalent size due to smaller gate to source bias voltages and body effects. This disadvantage can be overcome by using larger or faster transistors. Another solution is to reduce the threshold voltages of the driving transistors.

While specific embodiments of the invention have been illustrated and described herein, it is realized that other modifications and changes will occur to those skilled in the art. The basic structure for an output driver of the present invention comprises an n-channel pull up transistor and a p-channel pull down transistor. A circuit designer can use many kinds of equivalent circuits to build the same driver. We will discuss a few more examples in the following sections. It is to be understood that there are many other possible modifications and implementations so that the scope of the invention is not limited by the specific embodiments discussed herein.

Figure 3D:
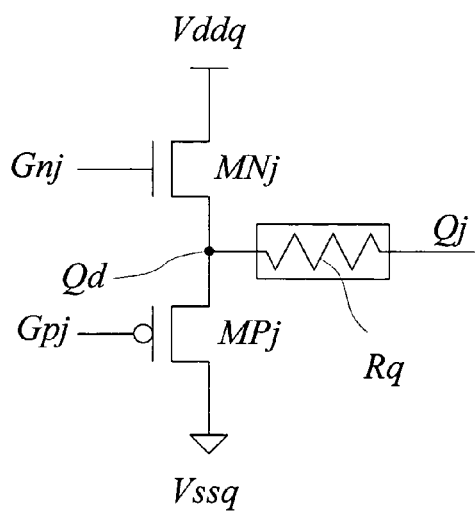

FIG. 3(d) shows a common modification where a serial termination resistor (Rq) or a current limiting device is placed between the internal signal line (Qd) of an output driver and an external signal line (Qj). Placing a serial termination resistor (Rq) or other types of current limiting devices this way can help to reduce signal reflections on the external signal line (Qj). The serial termination resistor (Rq) or current limiting devices can be placed inside or outside of IC chips. For example, DDR (double data rate) DRAM place such serial termination resistors outside while DDRII (second generation DDR) DRAM have the option to place the serial termination resistors inside the DRAM chips.

Figure 3E:
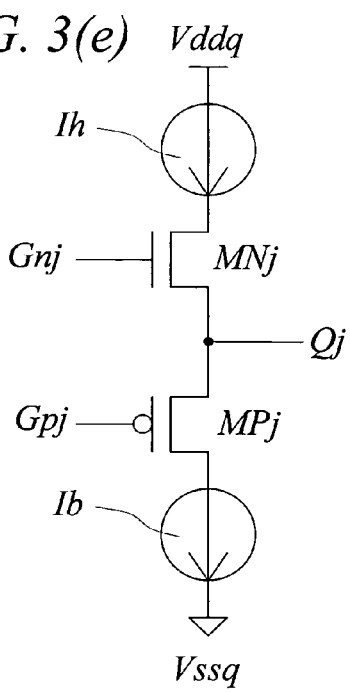

FIG. 3(e) shows another type of current limiting method for output drivers of the present invention. The source electrode of the n-channel pull up transistor (MNj) is connected to a current source (Ih) that is connected to power line at voltage Vddq. The source electrode of the p-channel pull down transistor (MPj) is also connected to another current source (Ib) that is connected to power line at voltage Vssq, where Vssq<Vddq. This modification assures that the driving current of the driver can never shoot higher than the currents provided by the current sources (Ih, Ib). This method is very effective in reducing switching noises, especially for inductance induced noises. Replacing the current sources (Ih, Ib) with resistors or other type of current limiting devices can have similar effects.

FIG. 3(d) represents current sources by symbols instead of actual transistor level schematics. A "current source" here can be one transistor that is biased into saturation conditions, a current limiting device such as a simple resistor, and it also can be a much more complicated circuit. The current sources referred in the present invention also do not need to be ideal current sources. Basically we call current limiting devices as current sources in our discussions. For all the circuit examples in our discussions, the current sources can be replaced by simple resistors or biased transistors and those circuits will still work. The most common circuits used as current sources are "current mirrors" that are well known to circuit designers. Methods to design current sources are well known to most of circuit designers so we will not describe in further details about the transistor level circuits for current sources. For simplicity, we will represent current limiting devices by an arrow in a circle as Ih or Ib in FIG. 3(d) and call it "current source". The scope of this invention should not be limited by detailed implementation of those current sources.

Figure 3F:
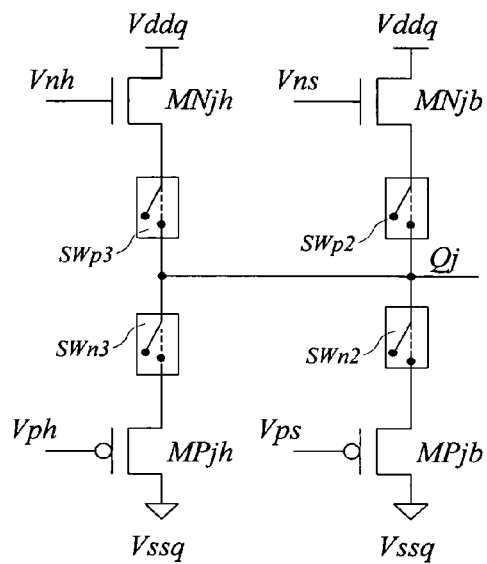
Figure 3G:
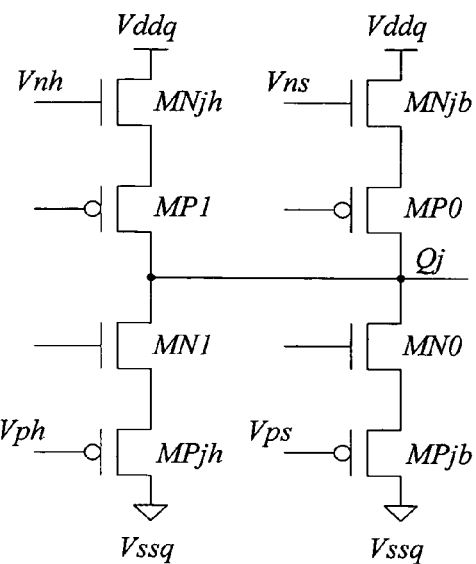

For the examples described in FIG. 3(b), we switch the gate voltages (Vgpj, Vgnj) to switch the output voltage (Vqj). FIG. 3(f) illustrates a modification of output driver that can achieve the same purpose without switching the gate voltages. The gate electrode of an n-channel pull up transistor (MNjh) is driven at a fixed voltage Vnh~Voh+Vtn. The source electrode of MNjh is connected to I/O power supply line at voltage Vddq, and the drain electrode of MNjh is connected to a switch (SWp3) that is connected to the external signal line (Qj). The gate electrode of another n-channel pull up transistor (MNjb) is driven at a fixed voltage Vns~Vos+Vtn. The source electrode of MNjb is connected to I/O power supply line at voltage Vddq, and the drain electrode of MNjb is connected to a switch (SWp2) that is connected to the external signal line (Qj). The gate electrode of a p-channel pull down transistor (MPjh) is driven at a fixed voltage Vph~Voh–Vtp. The source electrode of MPjh is connected to lower power supply line at voltage Vssq (Vssq<Vddq), and the drain electrode of MPjh is connected to a switch (SWn3) that is connected to the external signal line (Qj). The gate electrode of another p-channel pull down transistor (MPjb) is driven at a fixed voltage Vps~Vos–Vtp. The source electrode of MPjb is connected to lower power supply line at voltage Vssq, and the drain electrode of MPjb is connected to a switch (SWn2) that is connected to the external signal line (Qj). FIG. 3(g) illustrates one example of the transistor level schematic diagram for the circuit in FIG. 3(f). The steady state output voltages of the driver in FIG. 3(f) are determined by the states of the switches (SWp3, SWp2, SWn3, SWn2) according to table 1. By proper control of those switches, the driver in FIG. 3(f) can support the SAI functions shown in FIG. 3(b).

TABLE 1

| SWp3 state | SWp2 state | SWn3 state | SWn2 state | Driver output state |
|---|---|---|---|---|
| on | off | on | off | Pull to Voh |
| off | on | off | on | Pull to Vos |
| off | on | on | off | Driver off while holding Vqj between Voh and Vos |
| off | off | off | off | Driver completely off |

Figure 3H:
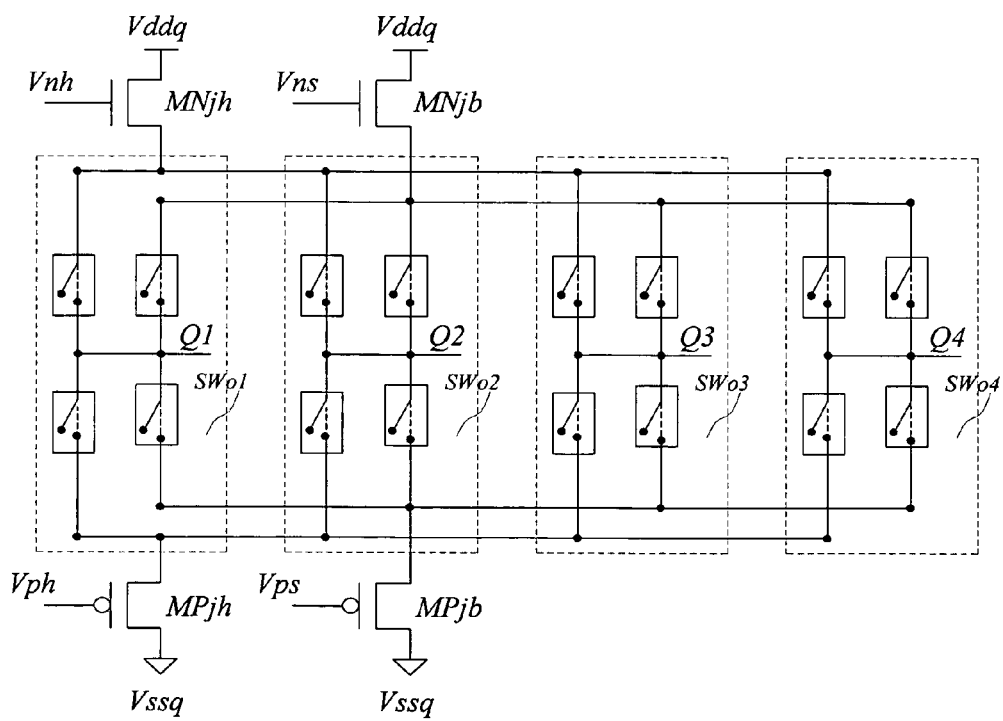

The major advantage of the driver in FIG. 3(f) is that it can have almost no capacitance coupling noise. During each switching event, the gate voltages are not changed while the control voltages on switches swing in opposite direction to cancel the coupling effects from each other. In this configuration, there is almost no limit on the size of driving transistors (MNjh, MNjb, MPjh, MPjb) because they are biased at constant voltages so that they would not cause any noise problems. It should be obvious that one set of driving transistors (MNjh, MNjb, MPjh, MPjb) can be shared by many switches that are connected to many output signals. FIG. 3(h) shows an example when one set of driving transistors (MNjh, MNjb, MPjh, MPjb) are shared by four 4-switch-sets (SWo1, SWo2, SWo3, SWo4) controlling 4 external signal lines (Q1, Q2, Q3, Q4). Each 4-switch-set (SWo1, SWo2, SWo3, SWo4) in FIG. 3(h) supports the same functions as the 4 switches (SWp3, SWp2, SWn3, SWn2) in FIG. 3(f) and each can control its output (Q1, Q2, Q3, Q4) in the same ways as listed in Table 1.

We certainly can combine multiple methods illustrated in FIGS. 3(d–g) to minimize noise problems.

Figure 3I:
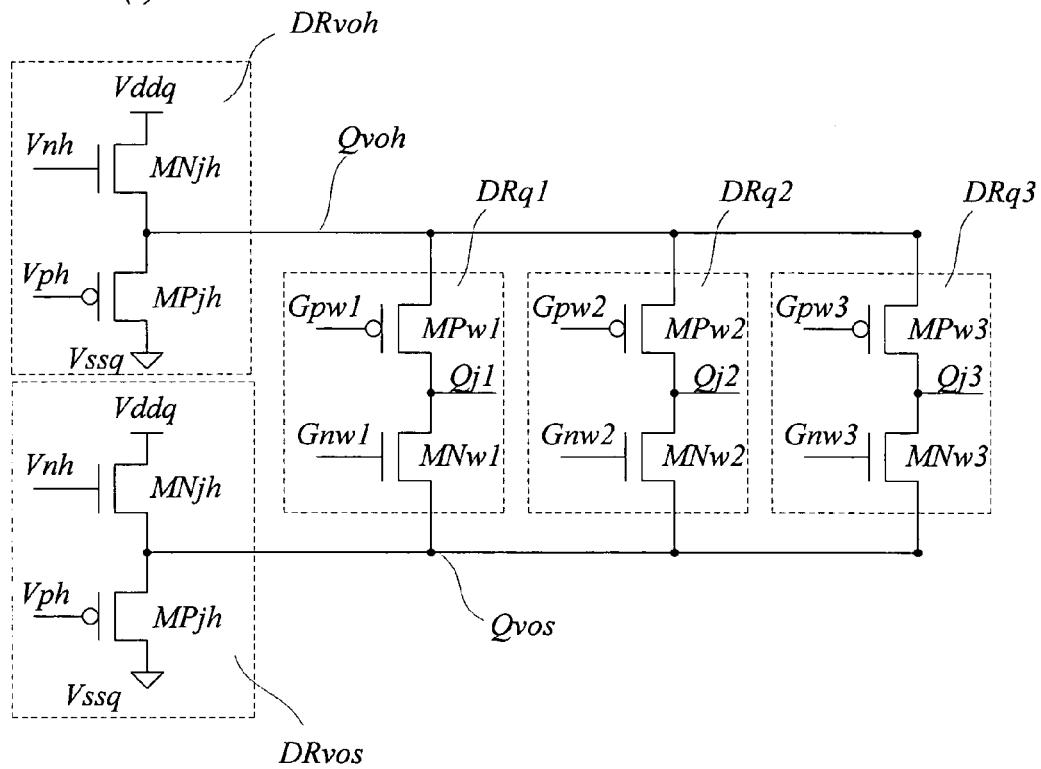

FIG. 3(i) shows a variation design that is more intuitive for prior art circuit designers. This circuit uses a driver (DRvoh) of the present invention that is configured to drive an internal line (Qvoh) at upper SAI voltage (Voh). This line (Qvoh) is connected to the source electrode(s) of one or a plurality of p-channel pull up transistors (MPw1, MPw2, MPw3). It also uses another driver (DRvos) of the present invention that is configured to drive an internal line (Qvos) at lower SAI voltage (Vos). This line (Qvos) is connected to the source electrode(s) of one or a plurality of n-channel pull down transistors (MNw1, MNw2, MNw3). The drain electrode(s) of p-channel pull up transistors (MPw1, MPw2, MPw3) and the drain electrode(s) of n-channel pull down transistors (MNw1, MNw2, MNw3) are connected to one or a plurality of external signal lines (Q1, Qj2, Qj3) as shown in FIG. 3(i). The drivers configured this way are able to drive SAI signals without using termination resistors. However, such drivers still suffer the same switching noises and coupling noises like prior art output drivers.

Figure 4A:
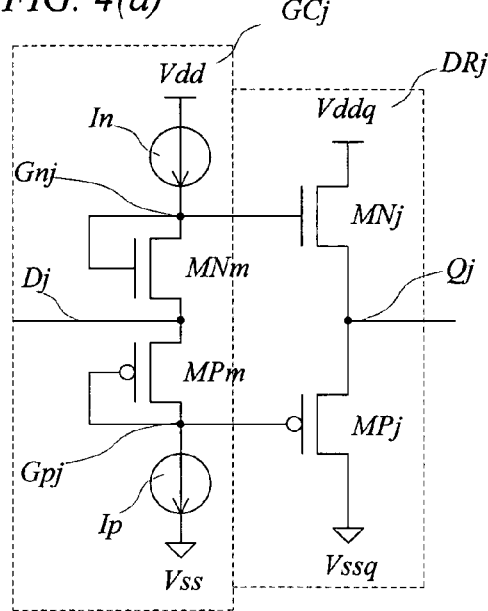
FIGS. 4(*a–f*) are schematic diagrams showing different gate voltage generation circuits to support output drivers of the present invention.

One of the requirements to use the output driver of the present invention is to provide gate voltages about one threshold voltage away from target voltages. The transistor threshold voltages (Vtn, Vtp) can be a complex function of manufacture procedures, substrate voltages, temperature, and device geometry. It is therefore a good practice to provide supporting circuits to generate proper gate voltages for the output drivers of the present invention. FIG. 4(a) is a schematic diagram illustrating one example of gate voltage generation circuits (GCj). The output driver (DRj) in FIG. 4(a) has the same structure as the output driver (DRj1) in FIG. 3(a). The gate electrode of the n-channel pull up transistor (MNj) is connected to the gate electrode and the source electrode of an n-channel matching transistor (MNm), and to one terminal of a current source (In). The other terminal of the current source (In) is connected to a power supply line at voltage Vdd. Vdd can be the same as Vddq; it also can be different. The drain electrode of the n-channel matching transistor (MNm) is connected to an input line (Dj) as shown in FIG. 4(a). The electrical properties of the matching transistor (MNm) should be as similar to the n-channel pull up transistor (MNj) as possible. For this circuit configuration, the gate voltage (Vgnj) of the n-channel pull up transistor (MNj) will be determined by the current (Iin) of the current source (In) and the input voltage (Vdj) of the input line (Dj) as $$Iin = Kn(Wnm/Lnm)(Vgnj-Vdj-Vtn)^2 \quad (EQ3)$$

Where (Wnm/Lnm) is the width/length ratio of the n-channel matching transistor (MNm), and Kn is a parameter related to electron mobility. If there is a good match between MNm and MNj, the parameter Kn in EQ1 and in EQ3 should be the same, and their threshold voltage should be the same. When the current (Iin) of the current source (In) is small, we have (Vgnj−Vdj)~Vtn, meeting the requirement to provide gate bias voltage close to one threshold voltage above the target voltage (Vdj). Using EQ1 and EQ3, when Vqj>Vdj, the driver current (Isn) of the n-channel pull up transistor can be written as $$Isn \sim Iin[(Wn/Ln)/(Wnm/Lnm)](Vqj-Vdj)^2 \quad (EQ4),$$

meaning that the n-channel pull up transistor (MNj) will try to pull Vqj toward Vdj, and that the channel current of the n-channel pull up transistor is proportional to the current (Iin) of the current source (In) in the gate voltage generation circuit (GCj).

Similarly, the gate electrode of the p-channel pull down transistor (MPj) is connected to the gate electrode and the source electrode of a matching p-channel transistor (MPm), and to one terminal of a current source (Ip). The other terminal of the current source (Ip) is connected to lower power supply line at voltage Vss, where Vss<Vdd. Vss can be the same as Vssq; it also can be different. The drain electrode of the matching transistor (MPm) is connected to the input line (Dj) as shown in FIG. 4(a). The electrical properties of the matching transistor (MPm) should be as similar to the p-channel pull down transistor (MPj) as possible. For the circuit configuration in FIG. 4(a), the gate voltage (Vgpj) of the p-channel pull down transistor (MPj) will be determined by the current (Iip) of the current source (Ip) and the input voltage (Vdj) on the input line (Dj) as $$Iip = Kp(Wpm/Lpm)(Vdj-Vgpj-Vtp)^2 \quad (EQ5)$$

Where (Wpm/Lpm) is the width/length ratio of the p-channel matching transistor (MPm), and Kp is a parameter related to hole mobility. If there is a good match between MPm and MPj, the parameter Kp in EQ2 and EQ5 should be identical, and they should have the same threshold voltage. When the current (Iip) of the current source (Ip) is small, we have (Vdj−Vgpj)~Vtp, meeting the requirement to provide gate bias voltage close to one threshold voltage below the target voltage (Vdj). Using EQ2 and EQ5, when Vdj>Vqj, the driver current (Isp) of the p-channel pull down transistor can be written as $$Isp \sim Iip[(Wp/Lp)/(Wpm/Lpm)](Vdj-Vqj)^2 \quad (EQ6),$$

meaning that the p-channel pull down transistor will try to pull Vqj toward Vdj, and the channel current of the p-channel pull down resistor (MPj) is proportional to the current (Iip) of the current source (Ip) in the gate voltage generation circuit (GCj).

If we let the two current sources (In, Ip) provide the same currents (Iin=Iip), and let [(Wn/Ln)/(Wnm/Lnm)]=[(Wp/Lp)/(Wpm/Lpm)], at steady state we will have Vqj~Vdj. In other words, the output voltage (Vqj) will automatically follow the input voltage (Vdj) when we use the gate voltage generator (GCj) in FIG. 4(a) to provide gate voltages for the driver (DRj). The steady state leakage current of the driver is roughly equal to Iin [(Wn/Ln)/(Wnm/Lnm)] under this condition. If the current sources (In, Ip) can be designed to be very close to ideal current sources, the driver circuit in FIG. 4(a) can be an excellent analog driver; the output voltage (Vqj) on external signal line (Qj) can follow the input voltage (Vdj) on the input signal line (Dj) with great accuracy.

Figure 4B:
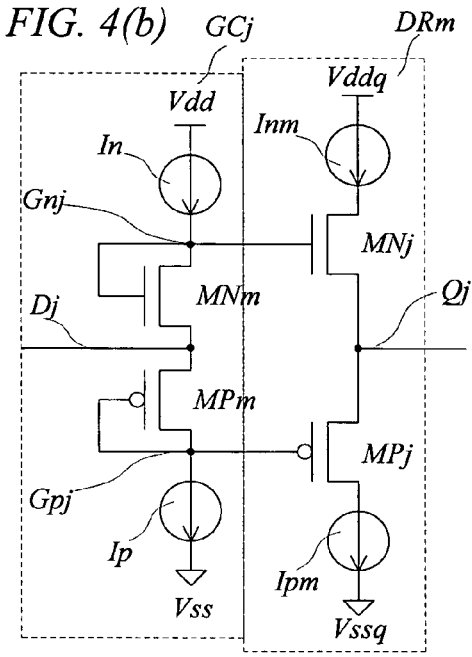

FIG. 4(b) shows another circuit example that has the same gate voltage generation circuits (CGj) as that in FIG. 4(a) while it has matching current sources (Inm, Ipm) at its output driver (DRm). The source of the n-channel pull up transistor (MNj) in this output driver (DRm) is connected to one terminal of a matching current source (Inm) that is designed to have matching properties with the current source (In) in the gate voltage generation circuit (GCj). The source of the p-channel pull down transistor (MPj) in the output driver (DRm) is connected to one terminal of a matching current source (Ipm) that is designed to have matching properties with the current source (Ip) in GCj. This circuit in FIG. 4(b) is designed to eliminate non-ideal effects caused by mismatches in source-to-drain bias voltages to achieve excellent accuracy. It has excellent control in both output voltages and output currents, making it ideal to support high accuracy applications.

Figure 4C:
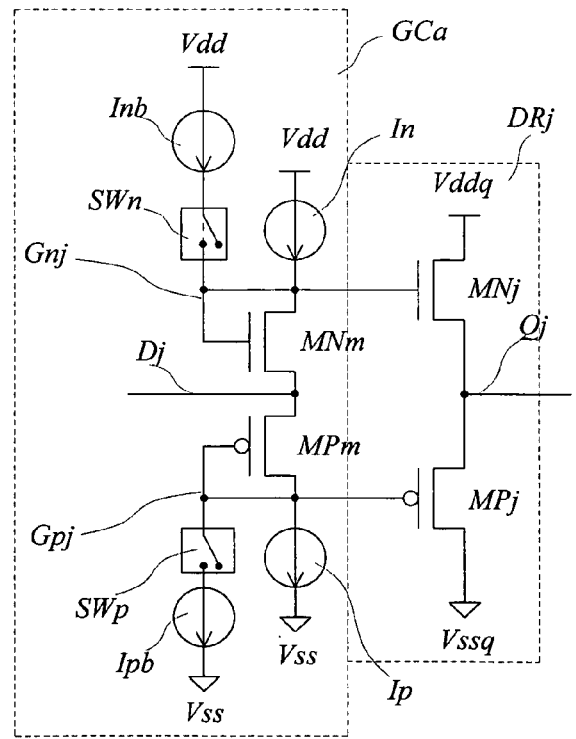

As shown by EQ3–EQ6, the driving power as well as the steady state leakage current of the driver in FIG. 4(a) are proportional to the currents of current sources (In, Ip) in the gate voltage generation circuit (GCj). For applications that require low power, we can minimize the currents to achieve extremely low power consumption while maintaining high accuracy. For applications that require high speed, we can increase the currents to achieve excellent switching speed while maintaining high accuracy. For applications that require both high switching speed as well as low power consumption, we can use variable current sources as shown by the example in FIG. 4(c). The output driver (DRj) in FIG. 4(c) has the same structures as the output driver in FIG. 4(a). The gate voltage generation circuit (GCa) in FIG. 4(c) has similar structures as the gate voltage generation circuit (GCj) in FIG. 4(a) except that the gate electrode (Gnj) of the n-channel pull up transistor (MNj) is connected to an additional switch (SWn) that is connected to an additional current source (Inb), and that the gate electrode (Gpj) of the p-channel pull down transistor (MPj) is connected to an additional switch (SWp) that is connected to an additional current source (Ipb) as shown in FIG. 4(c). In this example, the current source Inb provides much larger current than the current source In, and the current source Ipb provides much larger current than the current source Ip. When we need to switch the output voltage at high speed, we can turn on both switches (SWn, SWp) to increase the driving power of the driver (DRj). When the output voltage has been switched to steady state levels, we can turn off the switches (SWn, SWp) so that we can consume very low power to hold the output voltage at new voltage level. We also can turn on SWn while keeping SWp off to increase pull up speed without influencing pull down speed. We also can turn on SWp while keeping SWn off to increase pull down speed without influencing pull up speed. It is therefore possible to adjust the driving power of the output driver according to its needs at proper time periods. This example demonstrates our flexibilities in supporting both high speed and low power applications simultaneously using output drivers of the present inventions.

While specific embodiments of the invention have been illustrated and described herein, it is realized that other modifications and changes will occur to those skilled in the art. For example, we can replace the current sources in the above examples with other current limiting circuits such as resistors while the circuits will still work. The currents of the current sources certainly can be changed in analog methods instead of using switches. It is therefore to be understood that there are many other possible modifications and implementations so that the scope of the invention is not limited by the specific embodiments discussed in this patent disclosure.

Figure 4D:
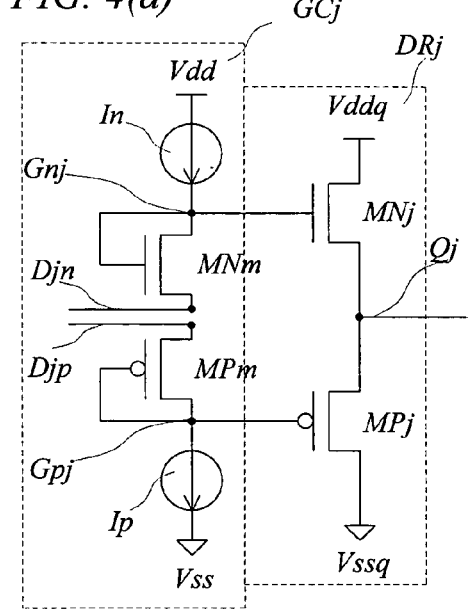

FIG. 4(d) shows one example of design variation for a circuit that is nearly identical to the circuit in FIG. 4(a) except that it has two input lines (Djn, Djp); one input line (Djn) is connected to the drain electrode of the n-channel matching transistor (MNm) while the other input line (Djp) is connected to the drain electrode of the p-channel matching transistor (MPm). Using two input lines (Djn, Djp) allow us to assign a target voltage for the n-channel pull up transistor (MNj) that is different from the target voltage for the p-channel pull down transistor (MPj). For example, if we assign the voltage (Vdjn) on Djn lower than the voltage (Vdjp) on Djp, we can reduce the steady state leakage current through MNj and MPj while setting the steady state output voltage somewhere between Vdjn and Vdjp. If we assign the voltage (Vdjn) on Djn higher than the voltage (Vdjp) on Djp, we can speed up the output voltage switching time while setting the steady state output voltage somewhere between Vdjn and Vdjp.

Figure 4E:
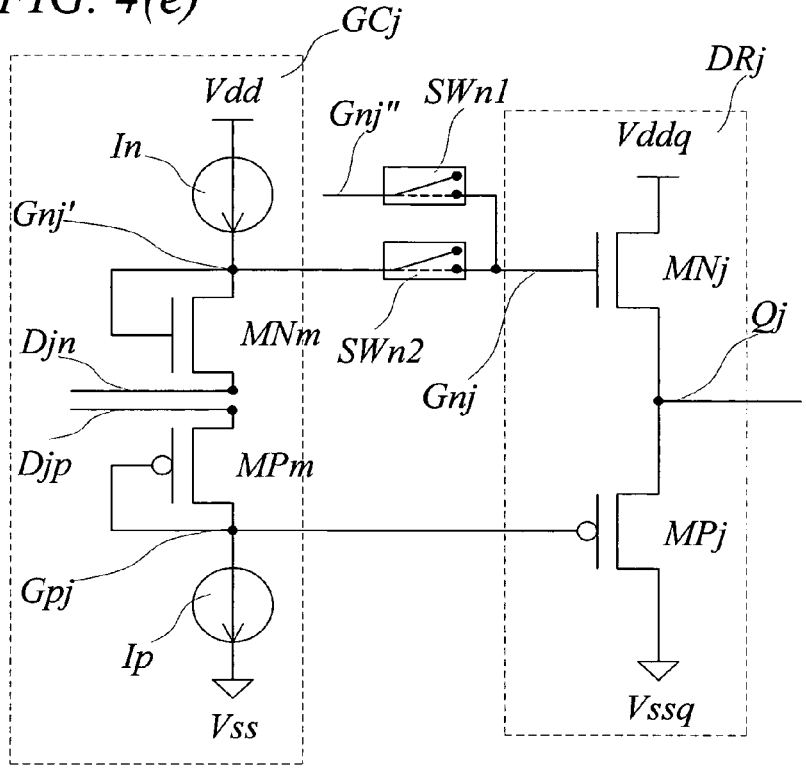

FIG. 4(e) shows another example of design variation for a circuit that is nearly identical to the circuit in FIG. 4(d) except that the gate electrode (Gnj) of the n-channel pull up transistor (MNj) is connected to two switches (SWn1, SWn2) allowing it to select either connecting to the gate electrode (Gnj') of the n-channel matching transistor (MNm) or a different line (Gnj") that is biased at a different gate voltage (Vgnj"). This circuit configuration provides a fast method to switch between different gate voltage generation circuits. One interesting option is to connect Gnj" to upper power supply line at voltage Vddq so that turning on SWn1 will provide strong driving power for quick output voltage pull up switching while we can switch back to Gnj' when the output voltage is close to target voltage. It should be obvious that we also can apply similar configuration changes shown in FIG. 4(e) to select gate voltages for the p-channel pull down transistor (MPj), or to apply the change for both driver transistors. We certainly can use more switches to select even more options.

Figure 4F:
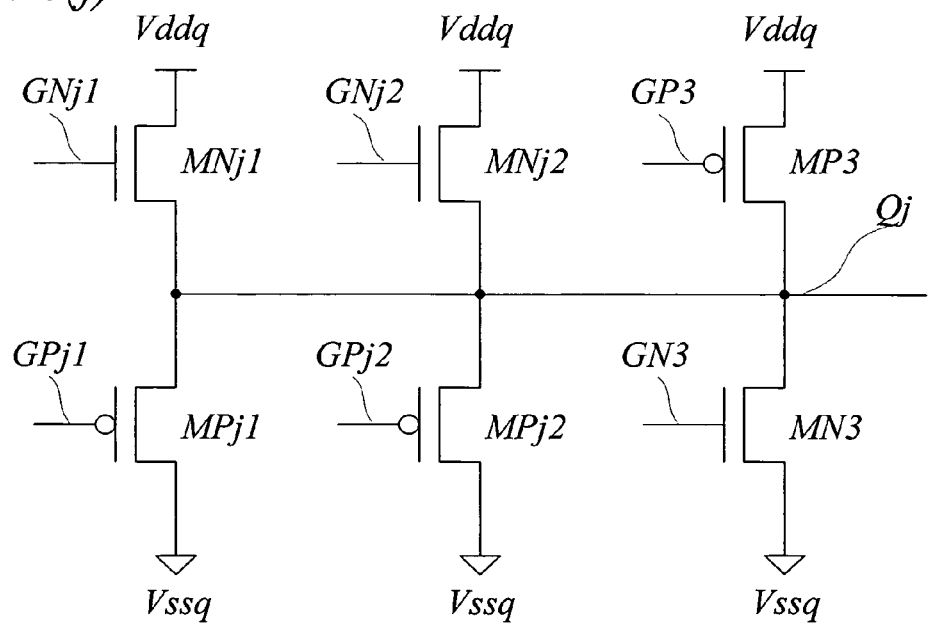

Multiple activated drivers of the present invention can drive the same output; it is even possible to have other types of drivers driving the same output line in parallel. FIG. 4(f) shows an example when two n-channel pull up transistors (MNj1, MNj2), one p-channel pull up transistor (MP3), two p-channel pull down transistors (MPj1, MPj2), and one n-channel pull down transistor (MN3) all drive the same output line (Qj) in parallel.

Figure 5A:
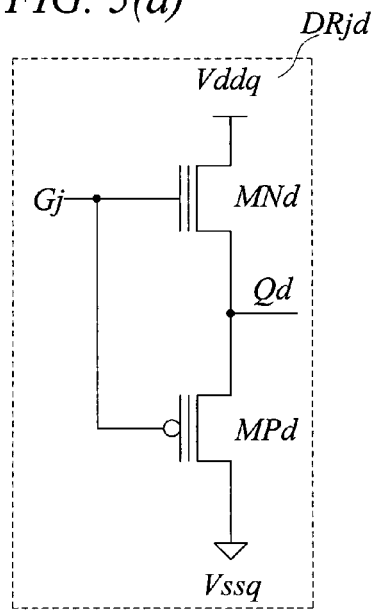
FIGS. 5(*a–c*) illustrate methods to use native transistors for output drivers of the present invention.

The examples in FIGS. 4(a–d) show various methods to provide gate voltages about one threshold voltage away from the target output voltage at operation conditions. One interesting method to meet the requirement is to use transistors with threshold voltages close to zero. A transistor with threshold voltage close to zero is called a "native transistor" in IC industry. FIG. 5(a) shows an output driver (DRjd) comprises a native n-channel pull up transistor (MNd) with threshold voltage Vtn~0, and a native p-channel pull down transistor (MPd) with threshold voltage Vtp~0. There is no standard symbol to represent native transistors so we use the symbols for floating gate transistors to represent native transistors in our schematic diagrams because floating gate transistors can be programmed to be a native transistor. Using native transistors, we can simply connect an input line (Gj) to the gate electrode of the native n-channel pull up transistor (MNd) as well as the gate electrode of the native p-channel pull down transistor (MPd), and the output voltage will follow the input voltage without using any gate voltage generation circuits. The circuit in 5(a) has enough accuracy to support digital switching interfaces such as HSTL or SSTL interfaces.

Prior art output drivers typically use enhance mode transistors with high threshold voltage in order to reduce leakage currents. Output drivers of the present invention have natural feedback mechanism to control leakage current. To have better driving power for the same size of transistors, it is desirable to use transistors with low threshold voltage, native transistors, or even depletion mode transistors for output drivers of the present invention. Most of current art IC technologies already provide native transistors. We also can add additional threshold adjusting masking steps to manufacture transistors with desired threshold voltages for applications of the present invention. Another interesting method is to use floating gate devices as the driver transistors because the threshold voltages of floating gate devices are programmable.

Figure 5B:
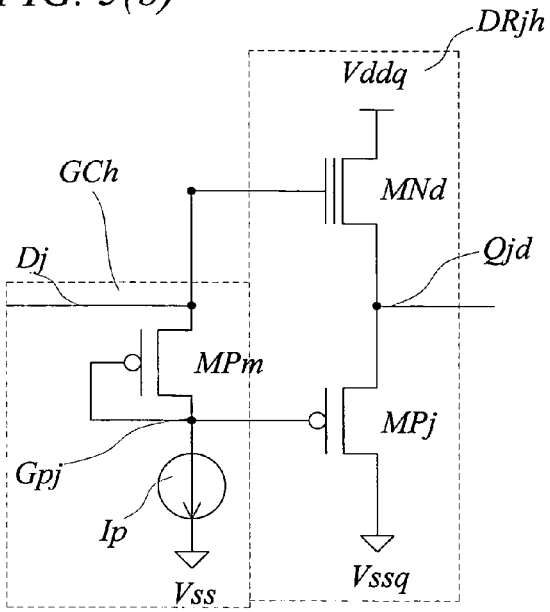

Most of current art IC technologies provide options for n-channel native transistors but few of them provide p-channel native transistors. FIG. 5(b) shows an output driver (Drjh) that has a native n-channel pull up transistor (MNd) and an enhanced mode p-channel pull down transistor (MPj). The supporting gate voltage generation circuit (GCh) directly connects an input line (Dj) to the gate electrode of MNd, while using a matching transistor (MPm) and a current source (Ip) to generate the gate voltage for the p-channel pull down transistor (MPj).

Figure 5C:
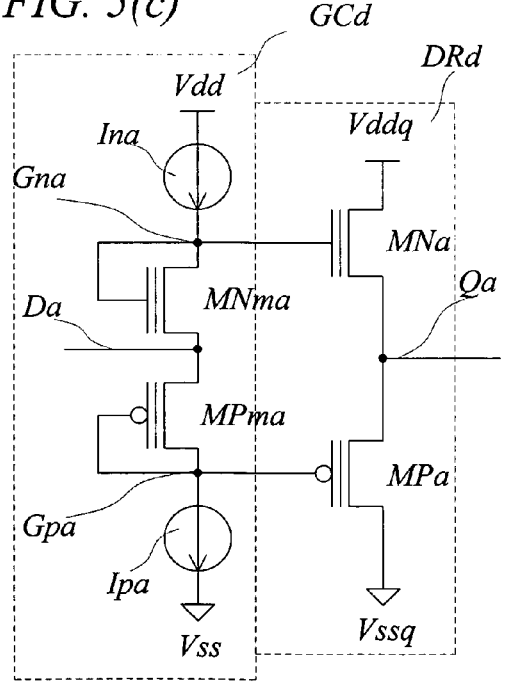

Due to body effects, the effective threshold voltage of a native transistor may not stay around 0 volts at different operations conditions. FIG. 5(c) shows an example that we still use gate voltage generation circuit (GCd) to adjust gate voltages even when native n-channel pull up transistor (MNa) and native p-channel pull down transistor (MPa) have been used in its output driver (DRd) stage. The matching transistors (MNma, MPma) in the supporting gate voltage generation circuits (GCd) also need to be native transistors. This circuit in FIG. 5(c) has better accuracy than the circuit in FIG. 5(a).

Prior art SAI drivers only can switch between two voltage levels (Voh and Vos) to represent one binary data per phase. The output drivers of the present invention have the accuracy to switch between multiple levels of analog voltages. It can easily support four-level data format to represent two binary bits per phase, or 16-level data format to represent 4 binary bits per phase. In other words, output drivers of the present invention will be able to improve data bandwidth while running at the same clock rate. When it is designed carefully, a driver of the present invention can support the functions of a high speed digital to analog (D/A) converter, providing output voltages switching between hundreds or thousands of analogy levels. Prior art high performance D/A converters consume large power. A D/A converter equipped with analog switching output driver of the present invention consume very little power while it can operate at high switching rate providing accurate outputs.

Figure 6:
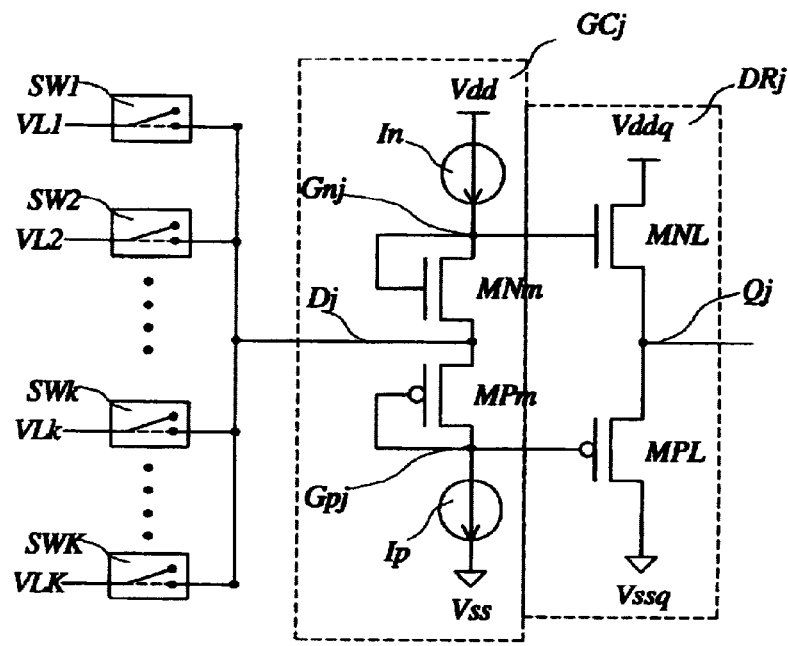
FIG. 6 shows an output driver of the present invention supporting multiple-level-switching output voltages.

FIG. 6 is a schematic diagram for the output driver in FIG. 4(a) to support multiple level switching operations using switch controlled inputs. The voltage on the input line (Dj) is controlled by a plurality of switches (SW1, SW2, . . . , SWk, . . . SWK) connected to a plurality of voltage sources at voltages (VL1, VL2, . . . , VLk, . . . VLK), where k and K are integers. The number of voltage level can be from 2 to thousands of levels. The target output voltage of the driver is determined by the state of the switches. The driving power and leakage current of the driver is determined by the currents provided by the current sources (In, Ip). Such output drivers of the present invention are ideal for many applications. Table 2 lists a few examples of potential applications.

TABLE 2

| Applications | voltage levels (#) | Switching frequency | Data rate (bit/second) |
|---|---|---|---|
| HSTL SRAM interface | 2 | 333 M | 666 M |
| SSTL DRAM interface | 2 | 266 M | 533 M |
| 4-level SAI interface | 4 | 500 M | 2 G |
| 8-level SAI interface | 8 | 500 M | 3 G |
| LCD driver for cellular phones | 64 | ~12 K | ~72 K |
| RGB display | 256 | ~60 M | ~480 M |

The numbers listed in table 2 are for references only; the actual numbers will change with detailed applications.

Current art HSTL SRAM interface is a two level small signal switching interface. Currently HSTL interface supports 333 MHZ DDR operations achieving 666 Mbits/second per data line. Output drivers of the present invention can support the same standard at higher switching rate without using termination resistors.

Current art SSTL DRAM interface is a two level small signal switching interface. Currently SSTL interface supports 226 MHZ DDRII operations achieving 533 Mbits/second per data line. Output drivers of the present invention can support the same standard at higher switching rate without using termination resistors.

Output drivers of the present invention can easily support 4-level switching at 500 MHZ clock rate to replace HSTL or SSTL interfaces. With careful design, 8-level or 16-level high speed switching are also possible.

Liquid crystal display (LCD) drivers come with many configurations. For example, an LCD driver can send out 132 RGB signals (total 396 digital-to-analogy converter output signals) with 6 bit accuracy (64 levels) switching at a relative low clock rate around 12 KHZ. For battery powered portable devices, power consumption is a major concern. Most of prior art digital-to-analog converters use operation amplifiers with negative feedback to provide high accuracy output signals, but operation amplifiers typically consume a lot of power and have poor switching speed. Tsuchi disclosed an LCD driver design in U.S. Pat. No. 6,124,997 that does not use operation amplifiers; the method requires pre-charging each output line before driving a new data. The pre-charge operation will consume power no matter the data is changed or not. Since Tsuchi only use pull down driver, the method is sensitive to noises that cause the output signal to drop below targeted voltages. Output drivers of the present invention have much better accuracy; they can hold the data at targeted value with little power; and they consume no power when the data is not changed. LCD drivers using output drivers of the present invention are therefore better than prior art products.

High resolution graphic display output 1024×900 pixels of RGB (red-green-blue) data with 8 bit resolution (256 levels) on each data. That requires outputting ~60 M 256-level data per second. Drivers of the present invention can support both the accuracy and the data rate.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A high performance integrated circuit (IC) output driver comprising:
   a first voltage supply source (Vddq);
   a second voltage supply source (Vssq) having a lower potential than said first voltage supply source;
   last stage output circuit(s) directly driving IC external output signal(s), said IC external output signal(s) is/are partial-voltage signals switching between voltage levels that are lower than Vddq and higher than Vssq, wherein said last stage output circuit(s) comprise(s):
   n-channel pull up transistor(s), wherein said n-channel pull up transistor(s) provide(s) majority of the driving force to drive said IC external signal(s) to higher voltage level(s); and
   p-channel pull down transistor(s), wherein said p-channel pull down transistor(s) provide(s) majority of the driving force to drive said IC external signal(s) to lower voltage level(s).

2. The n-channel pull up transistor(s) in the last stage output circuit(s) of the high performance IC output driver in claim 1 is an enhanced mode transistor.

3. The n-channel pull up transistor(s) in the last stage output circuit(s) of the high performance IC output driver in claim 1 is a native transistor.

4. The n-channel pull up transistor(s) in the last stage output circuit(s) of the high performance IC output driver in claim 1 is a depletion mode transistor.

5. The n-channel pull up transistor(s) in the last stage output circuit(s) of the high performance IC output driver in claim 1 is shared by a plurality of output drivers that are connected to a plurality of external signal lines.

6. The p-channel pull down transistor(s) in the last stage output circuit(s) of the high performance IC output driver in claim 1 is an enhanced mode transistor.

7. The p-channel pull down transistor(s) in the last stage output circuit(s) of the high performance IC output driver in claim 1 is a native transistor.

8. The p-channel pull down transistor(s) in the last stage output circuit(s) of the high performance IC output driver in claim 1 is a depletion mode transistor.

9. The p-channel pull down transistor(s) in the last stage output circuit(s) of the high performance IC output driver in claim 1 is shared by a plurality of output drivers that are connected to a plurality of external signal lines.

10. The high performance IC output driver in claim 1 is configured to support HSTL interface.

11. The high performance IC output driver in claim 1 is configured to support SSTL interface.

12. The high performance IC output driver in claim 1 is configured to multiple level small amplitude interfaces.

13. The high performance IC output driver in claim 1 is configured to support liquid crystal display drivers.

14. The high performance IC output driver in claim 1 is configured to support analog to digital converter outputs.

15. A method for designing high performance IC output driver comprising the steps of:
provㅤiding a first voltage supply source (Vddq);
providing a second voltage supply source (Vssq) having a lower potential than said first voltage supply source Vddq;
providing last stage output circuit(s) directly driving IC external output signal(s), wherein said IC external output signal(s) is/are partial-voltage signals switching between voltage levels that are lower than Vddq and higher than Vssq;
configuring one or more n-channel transistor(s) in said last stage output circuit(s) as pull up transistor(s) that provide(s) majority of the driving force to drive said IC external signal(s) to higher voltage level(s); and
configuring one or more p-channel transistor(s) in said last stage output circuit(s) as pull down transistor(s) that provide(s) majority of the driving force to drive said IC external signal(s) to higher voltage level(s).

16. The method in claim 15 comprises a step of configuring an enhanced mode n-channel transistor as a pull up transistor in the last stage output circuit(s) of the output driver.

17. The method in claim 15 comprises a step of configuring a native n-channel transistor as a pull up transistor in the last stage output circuit(s) of the output driver.

18. The method in claim 15 comprises a step of configuring a depletion mode n-channel transistor as a pull up transistor in the last stage output circuit(s) of the output driver.

19. The method in claim 15 comprises a step of configuring the n-channel pull up transistor(s) to support a plurality of output drivers that are connected to a plurality of external signal lines.

20. The method in claim 15 comprises a step of configuring an enhanced mode p-channel transistor as a pull down transistor in the last stage output circuit(s) of the output driver.

21. The method in claim 15 comprises a step of configuring a native p-channel transistor as a pull down transistor in the last stage output circuit(s) of the output driver.

22. The method in claim 15 comprises a step of configuring a depletion mode p-channel transistor as a pull down transistor in the last stage output circuit(s) of the output driver.

23. The method in claim 15 comprises a step of configuring the p-channel pull down transistor(s) to support a plurality of output drivers that are connected to a plurality of external signal lines.

24. The method in claim 15 configures the high performance output driver to support HSTL interface.

25. The method in claim 15 configures the high performance output driver to support SSTL interface.

26. The method in claim 15 configures the high performance output driver to support multiple level small amplitude interfaces.

27. The method in claim 15 configures the high performance output driver to support liquid crystal display drivers.

28. The method in claim 15 configures the high performance output driver to support analog to digital converter outputs.

* * * * *